United States Patent [19]

Pinkham

[11] Patent Number: 5,646,896
[45] Date of Patent: Jul. 8, 1997

[54] MEMORY DEVICE WITH REDUCED NUMBER OF FUSES

[75] Inventor: Ray Pinkham, San Jose, Calif.

[73] Assignee: Hyundai Electronics America, San Jose, Calif.

[21] Appl. No.: 550,587

[22] Filed: Oct. 31, 1995

[51] Int. Cl.$^6$ ........................................ G11C 7/00
[52] U.S. Cl. .................... 365/200; 365/96; 365/230.03; 365/230.05
[58] Field of Search .................. 365/200, 96, 230.03, 365/230.05

[56] References Cited

U.S. PATENT DOCUMENTS

| | | |
|---|---|---|
| 4,667,313 | 5/1987 | Pinkham et al. . |
| 4,961,171 | 10/1990 | Pinkham et al. . |
| 5,313,423 | 5/1994 | Sato et al. ........................ 365/200 |

OTHER PUBLICATIONS

Pinkham et al., "A 128K×8 70-MHz Multiport Video RAM with Auto Register Reload and 8×4 Block Write Feature," *IEEE Journal of Solid-State Circuits*, 23:1133-1139 (Oct., 1988).

Primary Examiner—David C. Nelms
Assistant Examiner—F. Niranan
Attorney, Agent, or Firm—Townsend and Townsend and Crew

[57] ABSTRACT

A redundancy circuit for a multiport memory device with first and second memories includes a fuse programming circuit, shared between the first and second memories, for programming a first redundant address. A first address compare circuit compares a received address for the first memory with the first redundant address. The first address compare circuit generates a redundant address selection signal when the received address is the same as the first redundant address. A second address compare circuit compares a second received address for the second memory with the first redundant address. The second address compare circuit generates a redundant address selection signal when the received address is the same as the first redundant address.

15 Claims, 6 Drawing Sheets

MEMORY DEVICE WITH REDUCED NUMBER OF FUSES

BACKGROUND OF THE INVENTION

The present invention relates to memory systems with redundant memory cells. More particularly, the present invention relates to the replacement of rows or columns in dual port memory systems using a reduced number of replacement fuses.

Advances in semiconductor fabrication techniques and in memory design have led to the commercial production of semiconductor memories which hold millions of bits of information. It is important that a manufacturer verify that each and every bit on chip are addressable before the chip is sold. However, due to the large number of bits on each chip, it is unrealistic to assume that chips can be fabricated with every bit position functioning. Physical defects in the manufacturing process tend to make it very difficult to manufacture devices of such a high bit density without one or more bits becoming defective. A manufacturer cannot sell a memory chip without ensuring that the full range of addresses are functional. Discarding chips having defective bits is wasteful, inefficient and costly. Thus, it is desirable to provide an approach which allows fabrication of a memory chip with redundant bits to compensate for the inevitable bit defects.

Designers have incorporated one or more redundant rows or columns into memory devices to provide a method of patching bit errors in memory chips. That is, redundant cells are provided which can be accessed when testing indicates the existence of bit defects in the memory. If, for example, a bit in a first column of a memory array is found to be defective, the entire first column is typically replaced by a substitute column. The patch is accomplished using a bank of polysilicon fuses. The address of the patched column is burned into the fuse bank using techniques known in the art. Thus, whenever the address of the defective column is presented to the memory, the replacement column will be accessed instead. This solution reduces the number of memory chips which are unusable due to defective bits. The solution, however, is costly in terms of the die space consumed by the fuse banks and the attendant comparator logic.

As a simple illustrative example, a single array of memory elements is formed from a number of physical rows and columns. The intersection of the rows and columns are bits which can be individually addressed. If one of these bits is defective, e.g., as a result of manufacturing or process defects, it must be replaced. It is generally considered impractical to repair bits within one physically continuous row or column without repairing all others in that row or column. Thus, if a bit is defective in, e.g., column A0, the entire column A0 may be replaced. A typical fuse bank which may be used to replace an entire row or column of a memory array could include two fuses for each address line (e.g., for line A0 and its compliment). Thus, using this approach, eighteen fuses would be needed to replace a single column or row for a nine bit wide address. The fuse bank is "programmed" by blowing appropriate fuses to indicate the address of the column or row to be replaced. These fuses are typically blown using a laser beam to burn open conductive polysilicon links. The code from the fuse bank is then sent to an address comparator. If the address sent to the memory array matches that stored in the fuse bank, the column normally accessed by that address is not accessed. The replacement column is accessed instead. This redundancy technique is particularly wasteful when the number of bits within a column becomes large, since a large number of bits are being committed for repair when only a relatively few are actually defective. The technique not only wastes bits, it also consumes a substantial amount of valuable die space. In this simple example, for a nine bit wide address, a total of eighteen fuses and a minimum of twenty-one transistors are needed (in addition to any transistors needed in an address comparator circuit) to implement a single replacement column.

The amount of die area consumed by fuses and compare logic can cause the die size of a memory device to grow with the number of total possible repairs. The fuses themselves consume die space. Valuable substrate area is further eroded as each fuse must be surrounded by a blank or "field" area to allow a laser beam to blow the fuse reliably without damaging nearby circuitry. Even with modern laser repair equipment, the fuse "pitch", i.e., the distance from the center of one fuse to the center of the next fuse, is typically four to six microns and the height of the fuse is typically six to eight microns. The die area associated with the fuse banks and compare blocks in such a scheme can approach several percent of the total die. Additional manufacturing cost is encountered from the physical blowing of all of the fuses. Thus, it is desirable to provide a redundancy approach which uses fewer fuses and which wastes fewer functional bits.

One way to reduce the number of wasted functional bits in, e.g., a repaired column, is to divide the memory into multiple physical arrays. Each sub-array can be repaired independently of the other sub-arrays, using local redundant rows and columns lying adjacent to each sub-array. This redundancy technique is more efficient than the single array scheme for a given number of redundant bits of storage, since fewer bits must be committed to repair for each row or column replacement and therefore more independent repairs are possible.

While the divided array allows more independent repairs for a given amount of redundant storage, the larger number of repairs is necessarily associated with a larger number of fuse banks. Essentially, each sub-array must have associated with it one fuse bank for each redundant row or column address repaired within that array. For example, if there are two redundant rows and two redundant columns within each sub-array, a memory device containing 16 sub arrays will contain 16×2×2=64 fuse banks, each with its own address comparator logic. The amount of die area consumed by these fuses and compare logic can cause the die size to grow substantially with the number of total possible repairs.

To reduce the number of fuses required to program a repaired address, designers have resorted to predecoded address schemes. Such predecoded schemes can reduce the number of fuses required to as low as $\log_2 n+1$ (where n is the number of address lines), although such schemes generally trade off a smaller number of fuses for considerably more transistors and interconnect in the address compare logic. Often, the predecoded addresses already exist to perform other functions; however, additional logic gates are required to implement the predecoded redundant address scheme. Whether the decoded or the non-decoded redundant address scheme consumes less die area is a function of lithographic design rules and the limitations of the laser repair equipment used and could differ for each application.

While the predecoding approach to redundant columns is helpful in reducing the number of fuses in typical systems, there are certain applications for which it is not particularly well suited. For example, the problem of redundancy and repair is complicated in multi-ported memory devices, such as the generalized dual port memory 10 shown in FIG. 1, or the devices disclosed in U.S. Pat. Nos. 4,636,986, 4,648,077, 4,747,081, or 4,866,678. These devices typically contain a random access memory (RAM) port 16 and a serial access memory (SAM) port 18. The SAM 14 may be, e.g., a serial register configured to receive a single addressed row from the RAM 12. Once the row of memory is transferred to the SAM, the SAM can be serially accessed independently and asynchronously to the RAM operation. One or more redundant columns 24 must be included for repair of bits in the RAM portion of memory. Correspondingly, one or more SAM register cells must also be replaced with redundant register cells 26 and programmed such that the redundant SAM register is accessed whenever it is desired to access data which has been transferred into the SAM from a corresponding redundant column in array 12. Typically, the SAM is accessed serially by fashioning the SAM as a small random access memory (RAM) and including a presettable counter used to provide addresses in sequence to the SAM. These addresses bear a one to one correspondence with the column addresses assigned to the memory array 12. Due to the asynchronous nature of the two ports after the transfer has occurred, the RAM 12 will typically access the repaired column address at a different time than when the SAM 14 will access the corresponding repaired SAM address via the counter and SAM control circuitry 22. Consequently, separate fuses and compare logic have traditionally been used on dual port memories for the columns of the RAM and the register cells of the SAM. The number of fuses is doubled even when a predecoding approach is used for the redundant RAM column addresses, due to the current need for separate fuses for the SAM. As discussed, this doubling of the repair circuitry is undesirable as it consumes valuable die area.

Accordingly, what is needed is an approach which provides redundant storage locations in dual port memory systems in a manner minimizing the amount of die area consumed by fuses and replacement circuitry. Preferably, the approach will eliminate the need to use separate fuse circuitry for the two ports of the memory.

SUMMARY OF THE INVENTION

Accordingly, a redundancy circuit for a memory device with first and second memories is provided which includes a fuse programming circuit, shared between the first and second memories, for programming a first redundant address. A first address compare circuit compares a received address for the first memory with the first redundant address. The first address compare circuit generates a redundant address selection signal when the received address is the same as the first redundant address. A second address compare circuit compares a second received address for the second memory with the first redundant address. The second address compare circuit generates a redundant address selection signal when the received address is the same as the first redundant address.

The redundancy circuit of the present invention may be used, e.g., in dual port memory devices such as video RAMs. Further, embodiments of the present invention may be used with other multi-ported memory devices, including single memories with more than one port.

The result is an ability to share fuse circuitry in multi-ported memory devices. This reduces manufacturing and handling costs in addition to the significant savings in die area.

For a fuller understanding of the nature and advantages of the invention, reference should be made to the ensuing description taken in conjunction with the accompanying drawings.

DESCRIPTION OF SPECIFIC EMBODIMENTS

One embodiment of the present invention will now be discussed by referring to FIGS. 2A and 2B. In particular, the embodiment to be described is designed for use in, e.g., a dual port memory device such as the device shown in FIG. 1 which has both a random and a serial access memory (RAM and SAM). The circuitry of FIG. 2 allows the two ports of a dual port memory device to share the same fuse program circuitry while maintaining separate address compare circuitry. The embodiment to be described is designed for use with a memory having six bit addresses designated A0–A5. Skilled practitioners will be capable of extending the teachings of this disclosure for use with other sizes of memory devices.

Figure 2A:
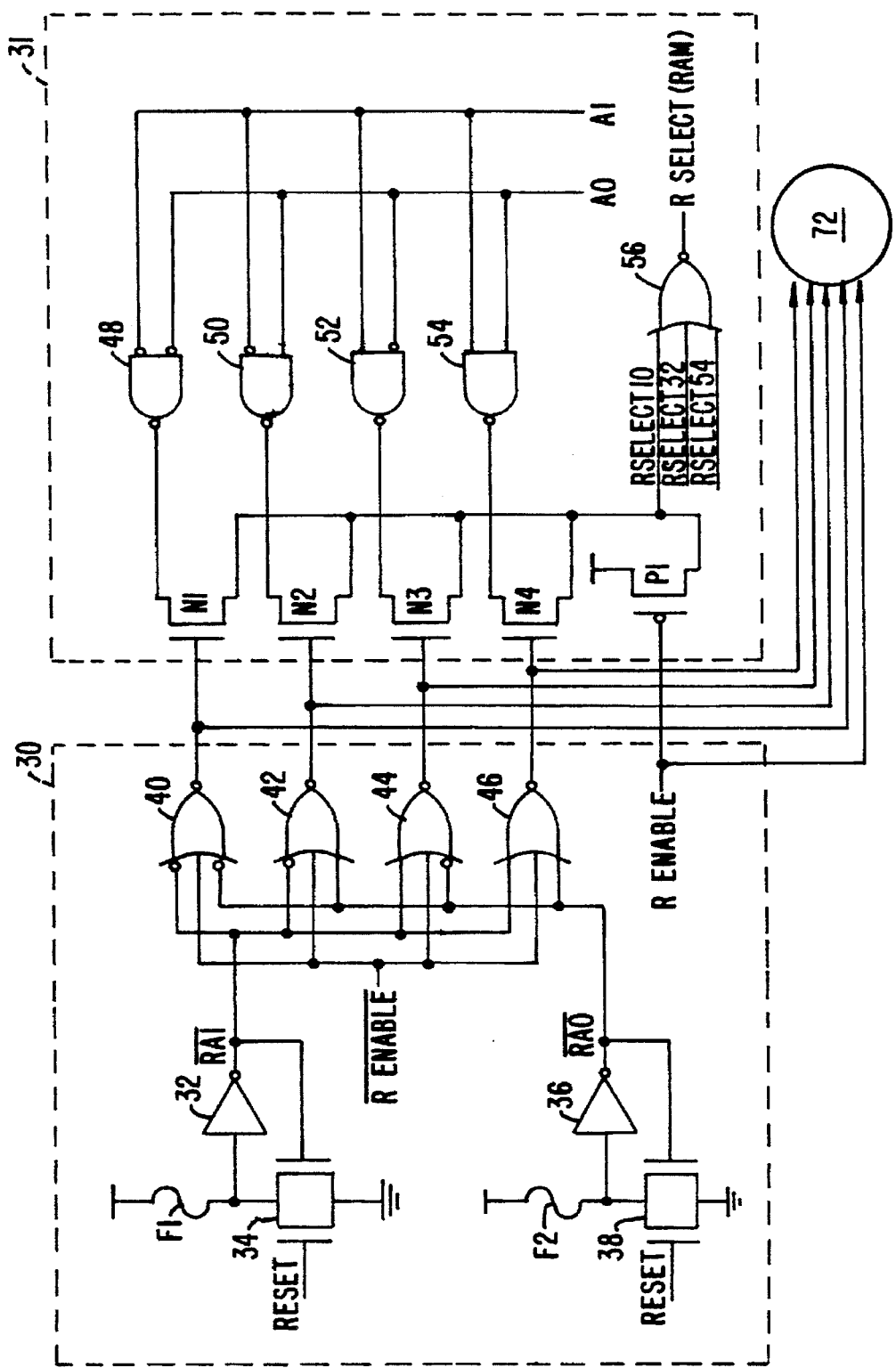
FIGS. 2A and 2B are circuit diagrams depicting redundancy circuits according to the present invention.
Figure 2B:
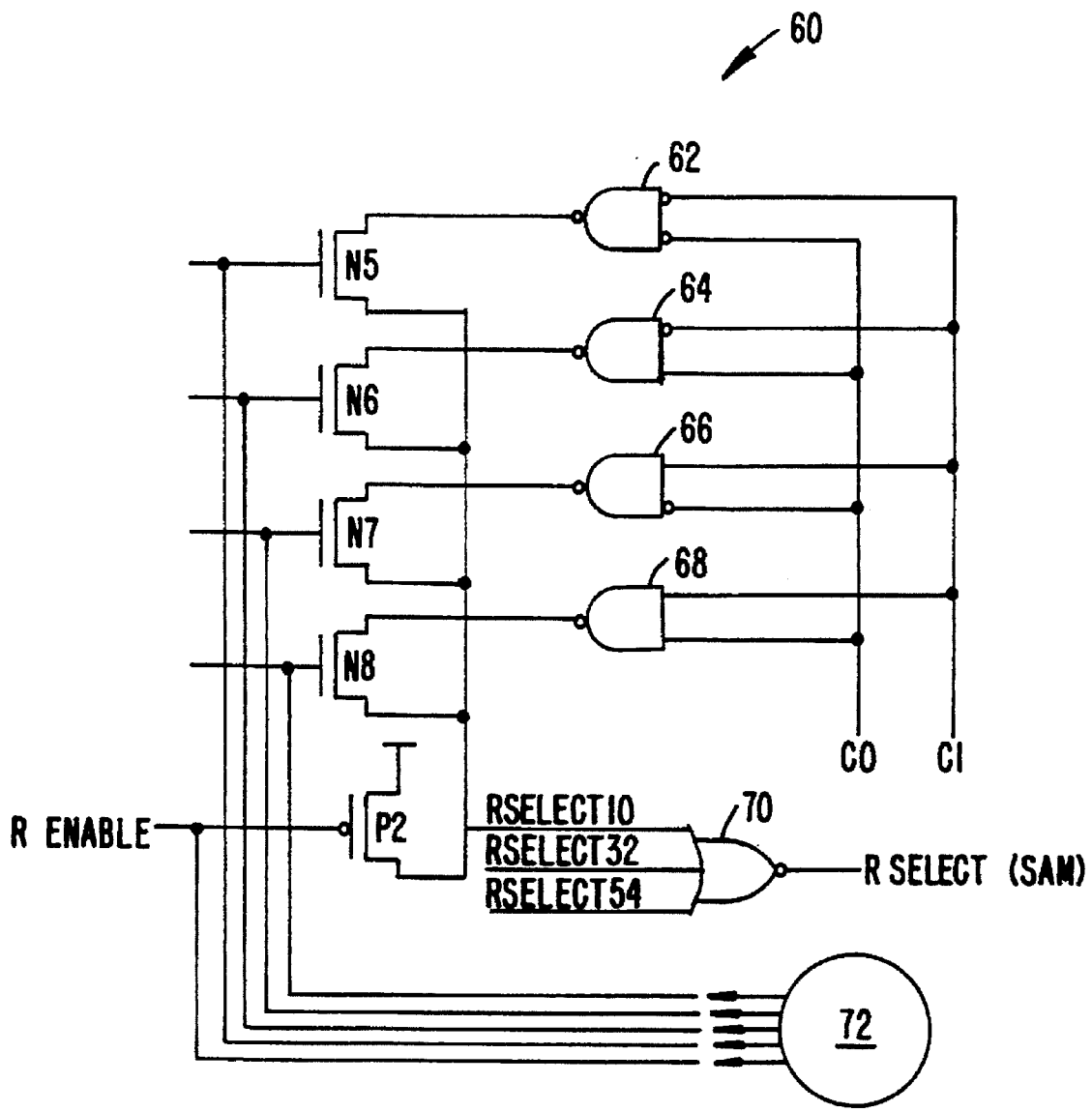

FIG. 2A depicts fuse program circuitry 30 and RAM address compare circuitry 31, while FIG. 2B depicts SAM address compare circuitry 60. The net result of the circuits of FIGS. 2A and 2B is that they allow the sharing of fuse program circuitry 30 between the RAM 12 and the SAM 14 using RAM address compare circuitry 31 and SAM address compare circuitry 60. This eliminates the need to duplicate the fuse program circuitry, saves valuable die space, and saves time during fuse blowing operations. Further, the approach enables use of a decoding approach to fuse bank implementation for both ports of the memory. This enables further savings of die space over previous schemes.

The fuse program circuitry 30 uses two fuses F1 and F2 for every two bits of address line. In the portion of the circuit shown, replacement address lines are depicted for addresses A0 and A1 of the RAM 12. Each of the groups of two bits (corresponding circuits, not shown, are provided for bit pairs A2/A3 and A4/A5) are input to a two to four decoder formed from NAND gates 48–54. Inverted inputs and outputs are designated, as is common in the art, by circles at inputs or outputs of the logic gate. The four outputs of the decoder correspond to the four different binary combinations of the input pair. If, for example, it is desired to repair an address for which A1, A0 is equal to 01, then fuse F1 would be blown and fuse F2 would not be blown. This combination in the fuse repair circuit 30 would cause the output of NOR gate 42 to go high while the other three NOR gates 40, 44, 46 would output low signals (assuming signal R_ENABLE# is asserted low). As NOR gate 42 outputs a high signal, the gate of NMOS transistor N2 is asserted, turning the transistor on. Each of the other NMOS transistors, N1, N3 and N4 are in a non-conductive state, as their gates are not asserted high.

If address lines A1, A0 are subsequently set equal to 10, the output of NAND gate 50 will go low and will be passed through to signal line RSELECT10 (again, assuming R_ENABLE is asserted low). If corresponding circuits for bit lines A2–A5 also indicate that the present address is to be replaced (i.e., RSELECT32 and RSELECT54 are all low), a signal R_SELECT(RAM) will be output high. This causes the RAM to access a replacement column for the asserted address. If any of the RSELECT signals input to NOR gate 56 are high, the replacement column will not be accessed.

Figure 1:
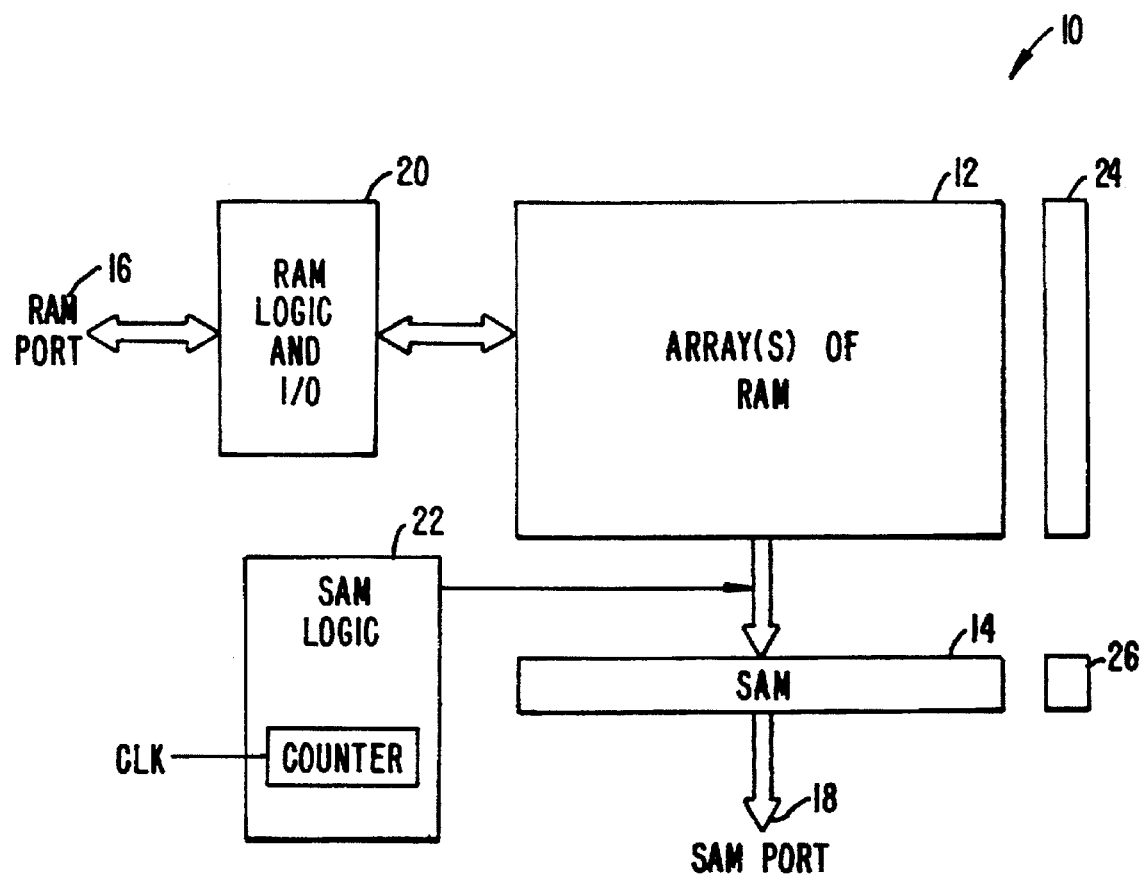
FIG. 1 is a generalized block diagram depicting elements of a typical dual port memory device including redundant storage elements and separate repair circuitry for the random and serial access memories.

The present invention avoids the need to duplicate fuse replacement circuitry by adding a SAM address compare circuit 60 which shares circuit 30 with the RAM address compare circuit 31. SAM address compare circuit 60 is similar to circuit 30 with the exception that the input to the two to four decoder are counter address bits C1–C0. As mentioned earlier, the SAM port 18 of the dual port memory system of FIG. 1 is typically accessed using a counter in SAM logic block 22. Thus, port 18 is a serial port. In a preferred embodiment of the present invention, SAM address compare circuit 60 is fed by counter bits corresponding to the address bits fed to the RAM address compare circuit 31. That is, for a six bit address device, address bits A0–A1 will be paired with counter bits C0–C1, A2–A3 with C2–C3, and A4–A5 with C4–C5. In this manner, the outputs of NOR gates 40–46 in fuse repair circuit 30 may be passed directly to the SAM address compare circuit 60, eliminating the need for a separate fuse repair circuit for the RAM and SAM portions of the memory device 10.

Address compare circuit 60 functions in a similar manner as the compare circuit 31. Assuming the repaired address is A1, A0=01, and NOR gate 42 outputs a logic one, NMOS transistor N6 will be turned on. If the counter bits C1,C0 are equal to 01, NAND gate 64 will output a logic zero which will be passed through as signal RSELECT10 to NOR gate 70. Only when each of the inputs to NOR gate 70 are low will a signal R_SELECT(SAM) be asserted, indicating the need to consult a replacement SAM location. Using this approach, the number of fuses required is reduced by at least half when compared to previous approaches.

Those skilled in the art will appreciate that the logic described may be modified as needed to accommodate different address sizes. Further, while specific gates have been described, this is only one specific embodiment. Other combinatorial logic arrangements may be used to implement features of the present invention.

Further, while this discussion has focused on dual port memories having a RAM port and a SAM port, the teachings of the invention may be employed to reduce fuse circuitry in a variety of other multiported devices. For example, a dual port static RAM is typically formed from two separate address and data ports interfaced to the same memory array of dual port memory cells. It is typical for one port to access a repaired row or column address while the opposite port is accessing some other address. Circuitry of the present invention may be used to share fuse repair circuitry in such a dual port memory device, as well as other memories using similar redundancy schemes.

Figure 3:
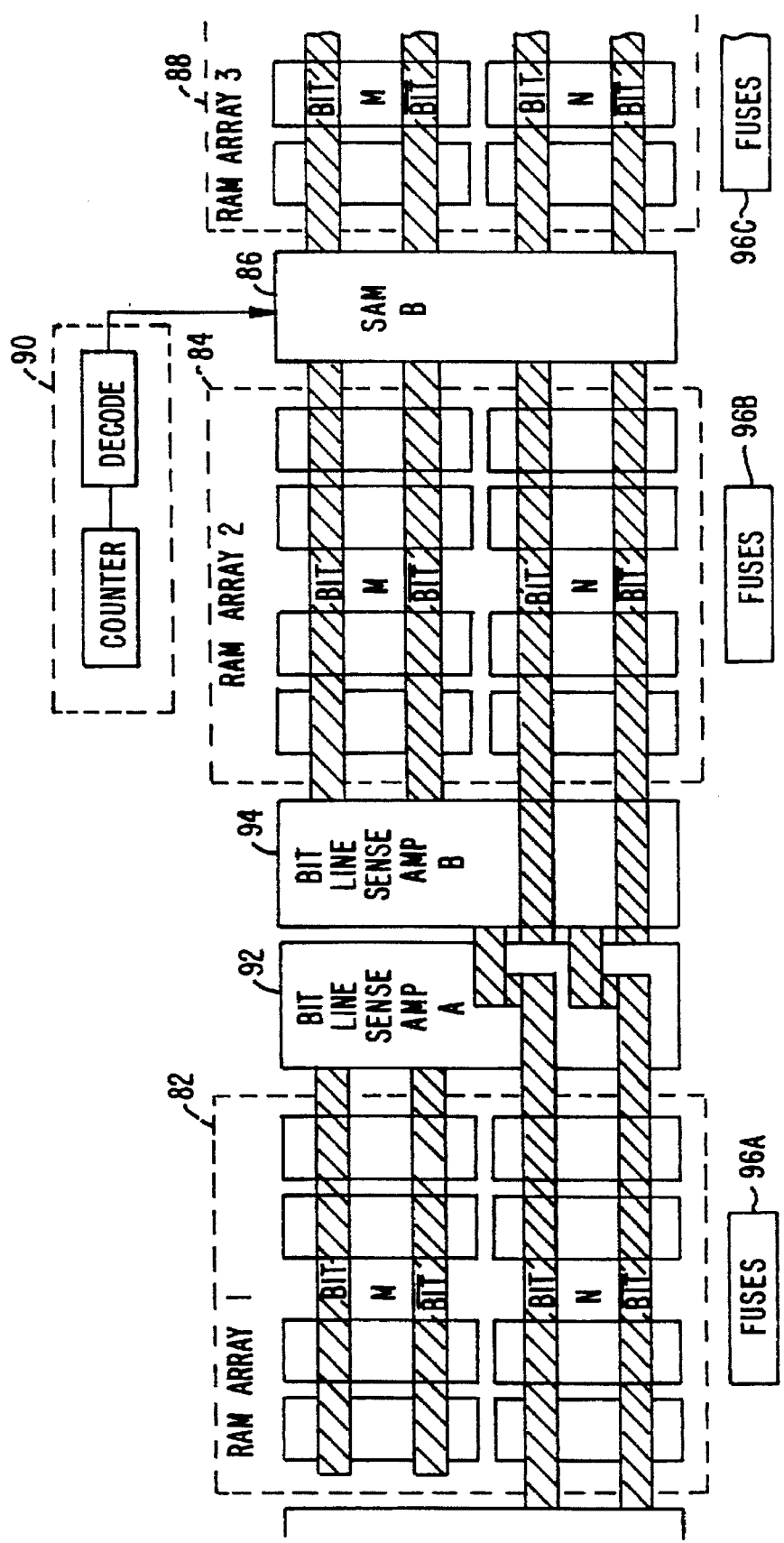
FIG. 3 is a block diagram depicting a dual port memory device using a shared sense amplifier, shared serial access memory configuration.

A further embodiment of the present invention will now be discussed by first referring to FIG. 3. As described above, it is advantageous, where possible, to treat each subarray of a memory as independently repairable. That is, any arbitrary column address may be repaired in a single subarray of memory without impacting any other arrays of the memory. Such repair, however, is complicated in multi-ported systems, as these systems have a number of components related to each subarray. FIG. 3 depicts an example of a portion of the circuitry which could be used to operate subarrays of a dual port memory device.

In this example, a SAM 86 is positioned between two RAM memory arrays 84, 88. Two bit line sense amplifiers 92, 94 are also positioned between two RAM arrays 82, 84, with bit line connections across columns M and N as shown. SAM 86 is configured such that it can hold an amount of data equal to that held in one half the number of columns. Specifically, in this example, SAM 86 can hold data from column M or column N from either array 84 or array 86, but it cannot hold data from both columns M and N. Those skilled in the art will recognize that the present invention may also be used in architectures where the bit width of the SAM is large enough to accommodate the entire number of columns of the RAM portion of memory.

FIG. 3 also shows the counter and decode circuit 90 used to access the SAM 86 once data has been loaded into it from either array 84 or array 88. The SAM 86 is typically loaded by accessing a row in either array 84 or array 88 and then transferring the data from columns in either array 84 or array 88 into corresponding register locations within the SAM 86. Once the column data is loaded into the SAM 86 from either array 84 or array 88, the SAM 86 must hold the data for an indefinite period of time and deliver the data through the SAM port upon demand. If, as in previous approaches, the fuses and address compare logic were each assigned to one specific memory array, a potential problem would occur if array 84 and array 88 had different repaired column addresses. For example, if column M has been repaired in array 84 but not in array 88, when the counter reaches address M, there must be some way provided to treat the access as repaired if data was most recently loaded from array 84 but unrepaired if data was most recently loaded from array 88. Present systems approach the problem by unconditionally repairing column M in array 88, even if it is not defective. In this way, separate fuses and compare logic can be employed for the SAM and programmed to unconditionally treat column M as a repaired address. This current approach, however, is unsatisfactory as it reduces repair efficiency by wasting a spare column to repair column M in array 88 when the column is not defective.

Figure 4:
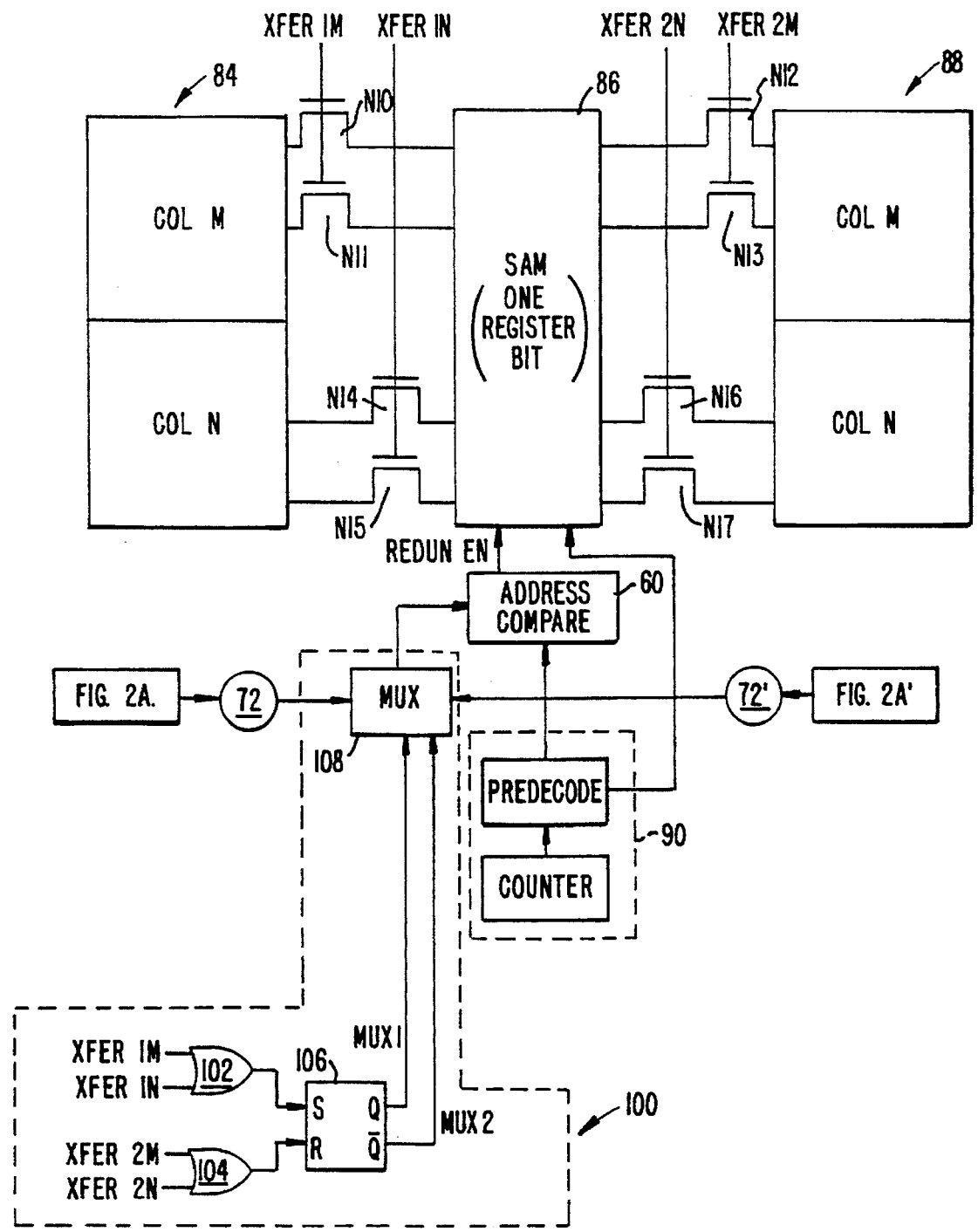
FIG. 4 is a block diagram depicting portion of a dual port memory device as shown in FIG. 3 further including a history multiplexor circuit according to the present invention.

Thus, an embodiment of the present invention is provided which allows independent repair of subarrays in dual port memory systems while also permitting the sharing of fuse and address compare circuitry between the two ports of the memory device. The repair circuitry will now be described by referring to FIG. 4, where a history mux circuit 100 is shown in conjunction with the two memory arrays 84, 88 and the shared SAM 86. The two memory arrays 84, 88 each have independent fuse and address repair circuits (30, 31 from FIG. 2A), for programming in repairs for defective columns in each array. Rather than inputting the output signals 72 from these circuits to two separate SAM address compare circuits, a multiplexor scheme using a history multiplexor circuit 100 is employed to enable the use of a single SAM address comparison circuit 60 for the shared SAM 86. This saves die space by reducing redundant logic components while avoiding the need for separate fuses for the RAM and SAM.

In particular, the outputs 72 from the fuse program circuitry 30 for each of the two RAM arrays 84, 88 are input to a two to one multiplexor circuit 108. Control signals MUX1 and MUX2 are input to the multiplexor circuit 108 to select which of the two inputs (72 or 72') are output from the multiplexor circuit 108 to SAM address compare circuitry 60. In one specific embodiment, if MUX1 is high, and MUX2 low, the signals 72 associated with array 84 will be passed through the multiplexor circuit 108 to SAM address compare circuit 60, while inputs 72' will be passed if MUX2 is high. If inputs 72 are passed on to the SAM address compare circuitry 60, the inputs will be checked for redundancy with respect to memory array 84. If inputs 72' are passed on, the redundancy will be checked with respect to array 88.

The control inputs (MUX1 and MUX2) to the multiplexor circuit 108 are generated based upon transfer line inputs which are commonly available on dual port memory devices. The transfer line inputs are used to enable the transfer of data from columns of RAM memory arrays to the SAM register for subsequent output from the second port of the dual port memory. For example, in the embodiment shown in FIG. 4, transfer line inputs XFER_1M and XFER_1N are used to transfer data from columns M and N of array 84 to the SAM, while lines XFER_2M and N are used to transfer data from columns M and N of array 88. These transfer lines are input to OR gates 102, 104 which indicate whether array 84 or 88 is selected. Outputs of OR gates 102 and 104 are input to a set-reset (SR) flip-flop 106.

Whenever transfer line inputs XFER_1M or XFER_1N are asserted high, data is transferred from array 84 to the SAM. Concurrently, the output of NOR gate 102 goes high, setting SR flip-flop 106 and causing SR flip-flop output signal MUX1 to go high and output signal MUX2 to go low. From this time until another transfer to the SAM is performed, the outputs of the circuit 2A associated with array 84 will be passed through the multiplexor circuit 108 to the SAM address compare logic 60, signifying that the last transfer to the SAM was from memory array 84. Thus, when the counter of SAM logic 90 reaches a column address within the SAM 86 that matches that of a repaired column in RAM array 84, the address will be determined as repaired and data from the SAM will be read from the associated spare column programmed at this address rather than the original, defective column. Similarly, whenever XFER_2M or XFER_2N are asserted high, data is transferred from RAM array 88 to the SAM and latched in the SAM for future read out through the serial read port of the two port memory device. Concurrently, the output of OR gate 104 goes high, resetting SR flip-flop 106 and causing SR flip-flop output signal MUX1 to go low and output signal MUX2 to go high. Form this time until another transfer to the SAM is performed, the outputs of the circuitry of FIG. 2A' associated with array 88 will passed through the multiplexor circuit 108 to the SAM address compare logic 60, signifying that the last transfer to the SAM was from RAM array 88. Thus, when the counter reaches a column address within the SAM 86 that matches that of a repaired column in RAM array 88, the address will be determined as repaired and data from the SAM 86 will be read from associated spare column programmed at this address rather than the original, defective column.

The result is an ability to share fuse circuitry in complex memory devices such as shared SAM memories which would otherwise require the costly duplication of the fuse circuitry. By eliminating the number of fuses required by, e.g., one half, a significant amount of die area is saved. Further, manufacturing and handling costs are saved by reducing the number of fuses which must be blown by precision laser procedures.

Figure 5:
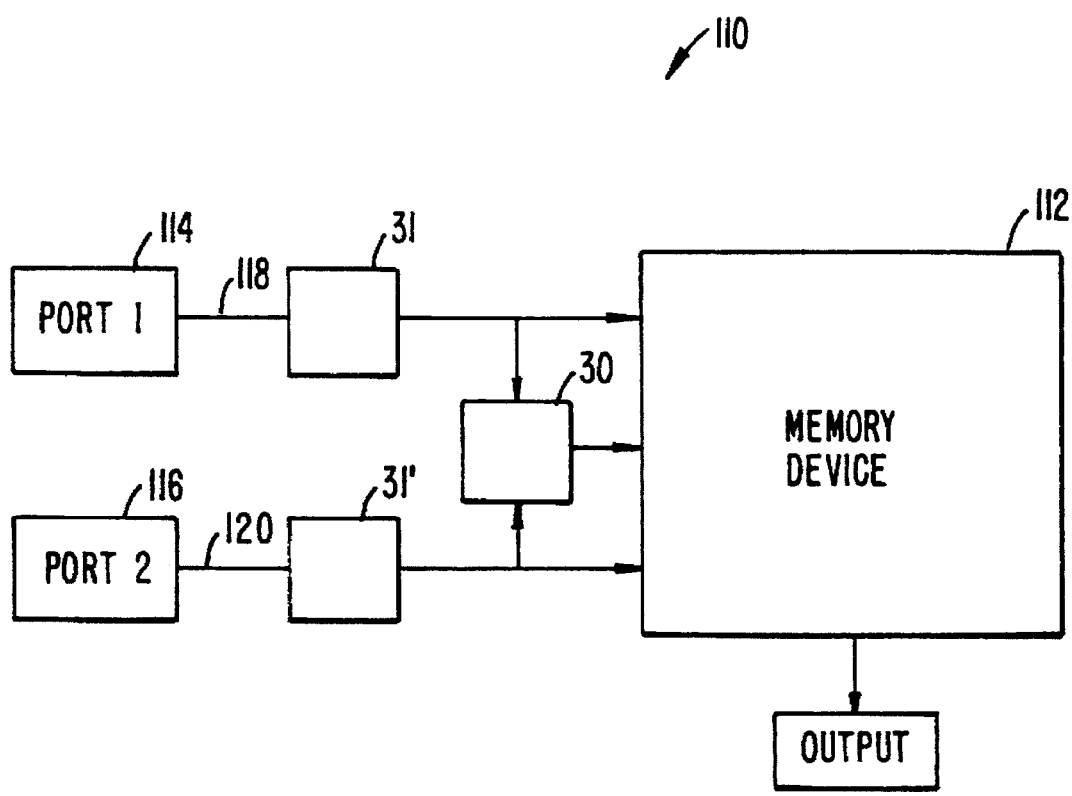
FIG. 5 is a block diagram depicting an embodiment of the present invention implemented in a multi-ported memory device.

While one particular embodiment for use in a dual port memory device such as a video DRAM has been described, features of the present invention may also be implemented in other multiple port memory devices. Referring now to FIG. 5, a block diagram of a dual port memory 110 having a single memory 112 is shown. Two ports 114, 116 access the memory 112. Each port has separate address lines 118, 120 which are coupled to address compare circuitry 31, 31' and to the memory 112. The two ports 114, 116 share fuses through use of the address compare circuitry 31, 31' and fuse program circuitry 30. This saves valuable die space and reduces manufacturing time and cost while ensuring the repairability of memory 112.

As will be appreciated by those familiar with the art, the present invention may be embodied in other specific forms without departing from the spirit or essential characteristics thereof. For example, embodiments described may be used in conjunction with a number of memory products or other devices requiring redundancy. The circuits could be adapted to function with active low or active high signals. The circuits could also be adapted to be positive and/or negative edge triggered. Those skilled in the art, upon reading this disclosure, will be able to vary transistor types to suit a particular need.

Accordingly, the disclosure of the invention is intended to be illustrative, but not limiting, of the scope of the invention which is set forth in the following claims.

What is claimed is:

1. A redundancy circuit for a memory device having a first memory and a second memory, the redundancy circuit comprising:
  a shared fuse programming circuit, shared between said first and second memories, for programming a first redundant address;
  a first address compare circuit, coupled to said shared fuse programming circuit, for comparing a received address for said first memory with said first redundant address, said first address compare circuit generating a redundant address selection signal when said received address is the same as said first redundant address; and
  a second address compare circuit, coupled to said shared fuse programming circuit, for comparing a second received address for said second memory with said first redundant address, said second address compare circuit generating a redundant address selection signal when said received address is the same as said first redundant address.

2. The redundancy circuit of claim 1 further comprising:
  a third memory;
  a second shared fuse programming circuit, shared between said second and third memories, for programming a second redundant address;
  a third address compare circuit, coupled to said second shared fuse programming circuit, for comparing a received address for said third memory with said second redundant address, said third address compare circuit generating a redundant address selection signal when said received address is the same as said second redundant address;
  a history multiplexor circuit, receiving control signals indicating whether said first or said third memories are to be used, for selecting between said first and third address compare circuits.

3. The redundancy circuit of claim 1 wherein said first memory is a random access memory and said second memory is a serial access memory.

4. The redundancy circuit of claim 1 wherein said shared fuse programming circuit includes a fuse for each bit of a replaced address.

5. The redundancy circuit of claim 3 wherein said second memory is addressed serially using a counter and wherein said received address is formed from bits received from said counter.

6. The redundancy circuit of claim 3 wherein said first memory is formed into arrays including at least a first and a second array, said first and second arrays sharing said second memory.

7. A redundancy circuit for a multi-port memory device, comprising:

a first memory;

shared fuse programming circuitry, coupled to said first memory, for programming redundant addresses for said first memory;

a first port coupled to address said first memory;

first address compare circuitry, coupled to said first port and to said shared fuse programming circuitry, for comparing an address received from said first port with an address programmed in said fuse programming circuitry;

a second port coupled to address said first memory; and second address compare circuitry, coupled to said second port and to said shared fuse programming circuitry, for comparing an address received from said second port with an address programmed in said shared fuse programming circuitry.

8. The redundancy circuit of claim 7, wherein said shared fuse programming circuitry includes a fuse for each bit of a replaced address.

9. The redundancy circuit of claim 7 further comprising a second memory accessed by said second port.

10. The redundancy circuit of claim 7, wherein said first address compare circuitry generates a redundancy signal when said address received from said first port matches said redundant address.

11. The redundancy circuit of claim 7, wherein said second address compare circuitry generates a redundancy signal when said address received from said second port matches said redundant address.

12. The redundancy circuit of claim 7, wherein said memory is accessed asynchronously from said first and second ports.

13. A method for accessing a redundant address in a dual port memory device having a first port for accessing a first memory and a second port for accessing a second memory, the method comprising the steps of:

programming a redundant address in a shared fuse bank, said fuse bank shared between said first and second memories;

receiving a desired address in said first port;

comparing said desired address, in an address compare circuit, with said redundant address, said address compare circuit coupled to said shared fuse bank; and accessing said redundant address if said desired address matches said redundant address programmed in said shared fuse bank.

14. The method of claim 13, wherein said first memory is a random access memory and said second memory is a serial access memory.

15. Apparatus for accessing redundant memory locations for use with a dual port memory device having a first memory, a second memory, and a third memory the apparatus comprising:

first fuse programming means, shared between said first and second memories, for programming a first redundant address;

second fuse programing means, shared between said second and third memories, for programming a second redundant address;

first address compare means for comparing a received address for said first memory with said first redundant address, said first address compare means generating a redundant address selection signal when said received address is the same as said first redundant address;

second address compare means for comparing a second received address for said second memory with said first redundant address, said second address compare circuit generating a redundant address selection signal when said received address is the same as said first redundant address;

third address compare means for comparing a received address for said third memory with said second redundant address, said third address compare circuit generating a redundant address selection signal when said received address is the same as said second redundant address; and history multiplexor means, receiving control signals indicating whether said first or said third memories are to be used, for selecting between said first and third address compare circuits.

* * * * *